United States Patent [19]

Hiiro

[11] Patent Number: 4,963,003
[45] Date of Patent: Oct. 16, 1990

[54] LASER OPTICAL SYSTEM

[75] Inventor: Hiroyuki Hiiro, Kanagawa, Japan

[73] Assignee: Fuji Photo Film Co., Ltd., Kanagawa, Japan

[21] Appl. No.: 312,167

[22] Filed: Feb. 21, 1989

[30] Foreign Application Priority Data

Feb. 22, 1988 [JP] Japan .................................. 63-38941

[51] Int. Cl.$^5$ ............................................. G02B 27/28
[52] U.S. Cl. .................................... 350/403; 350/370
[58] Field of Search .................... 350/3.6, 3.7, 162.12, 350/162.16, 167, 370, 403; 372/50, 46

[56] References Cited

U.S. PATENT DOCUMENTS

| | | | |
|---|---|---|---|
| 3,877,789 | 4/1975 | Marie | 350/147 |
| 4,643,534 | 2/1987 | Chun et al. | 350/403 |
| 4,703,992 | 11/1987 | Yeh | 350/3.64 |
| 4,810,047 | 3/1989 | Pernick | 350/3.72 |
| 4,832,446 | 5/1989 | Miyagawa | 350/162.12 |
| 4,832,469 | 5/1989 | Noguchi et al. | 350/404 |

Primary Examiner—Bruce Y. Arnold
Assistant Examiner—J. P. Ryan
Attorney, Agent, or Firm—Sughrue, Mion, Zinn, MacPeak & Seas

[57] ABSTRACT

A laser optical system is designated to obtain Gaussian beams by correcting phases of laser beams emitted from a laser which oscillates on transverse multimodes. A spectral element is adapted to separate spectroscopically the laser beams in each transverse multimode which are emitted from the laser in such a way that the respective transverse modes for each order appear as their corresponding luminescent points on each of the phase correcting elements. A correction is performed by the phase correcting plate so that the phase between each adjacent luminescent point becomes the same phase, whereby the laser beams are reflected to the spectral element. The laser beams thus phase-corrected are combined into one, thereby obtaining Gaussian beams.

15 Claims, 12 Drawing Sheets

FAR FIELD ANGLE (deg)

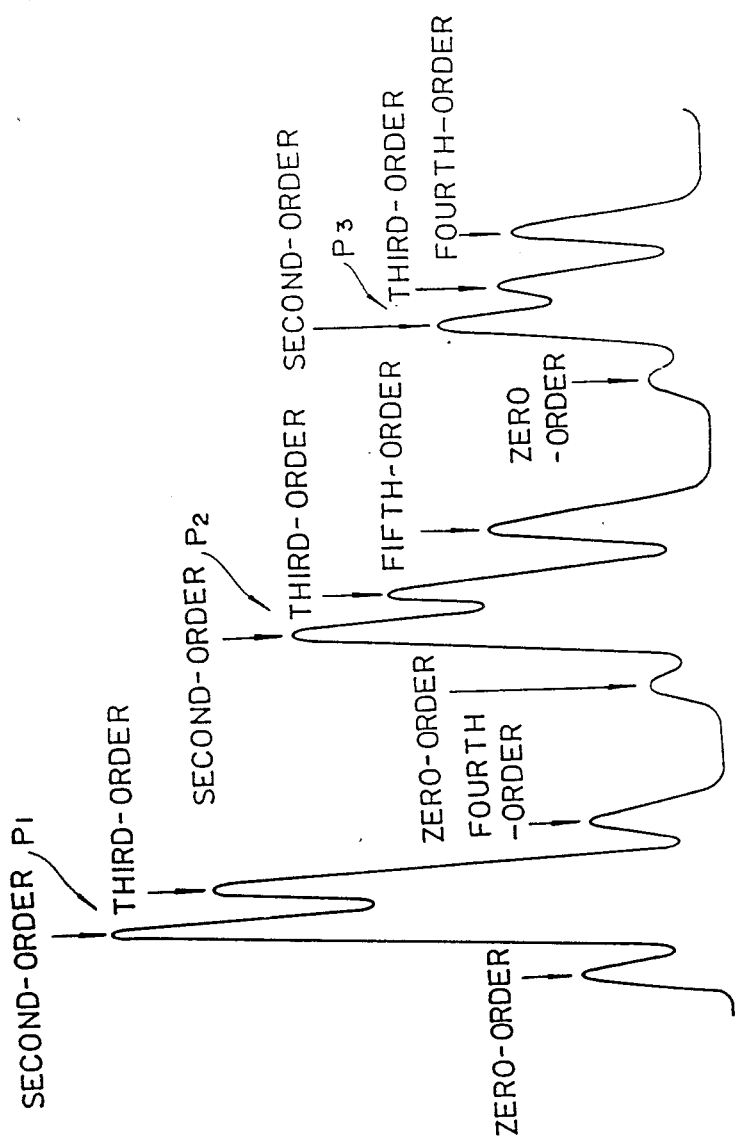

FIG. 7(A) (ZERO-ORDER TRANSVERSE MODE)
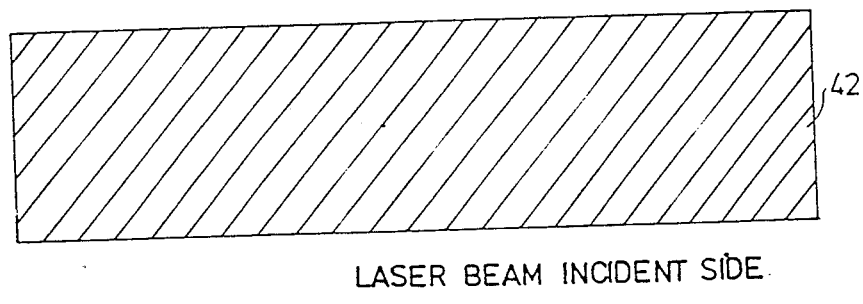
LASER BEAM INCIDENT SIDE
FIG. 7(B)
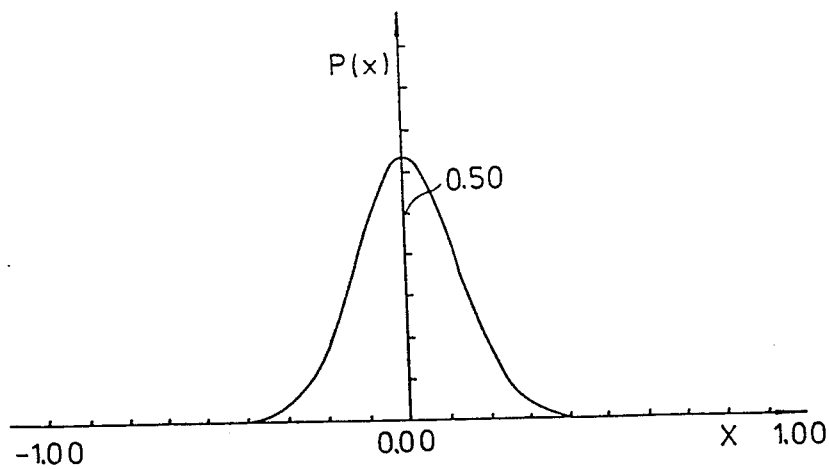

FIG. 8(A) (FIRST-ORDER TRANSVERSE MODE)
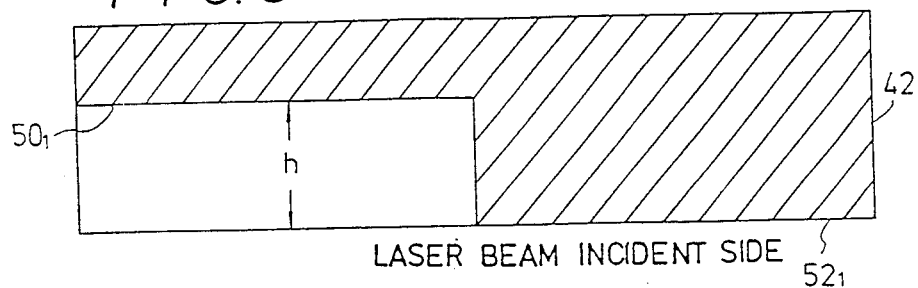
FIG. 8(B)
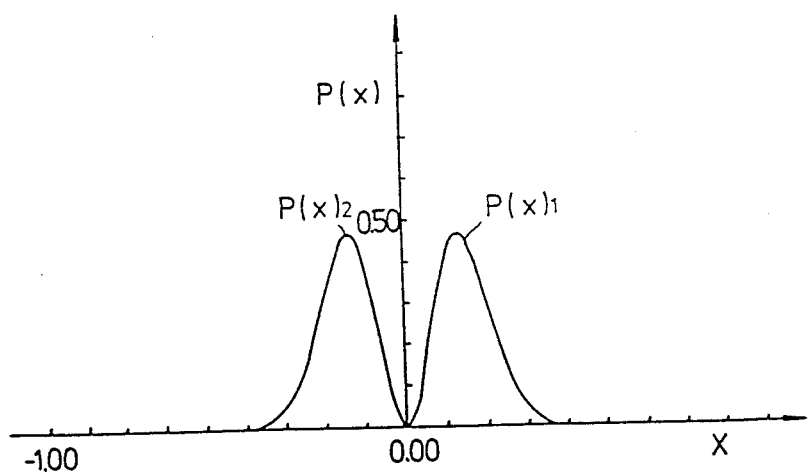

F I G. 9 (A) (SECOND-ORDER TRANSVERSE MODE)
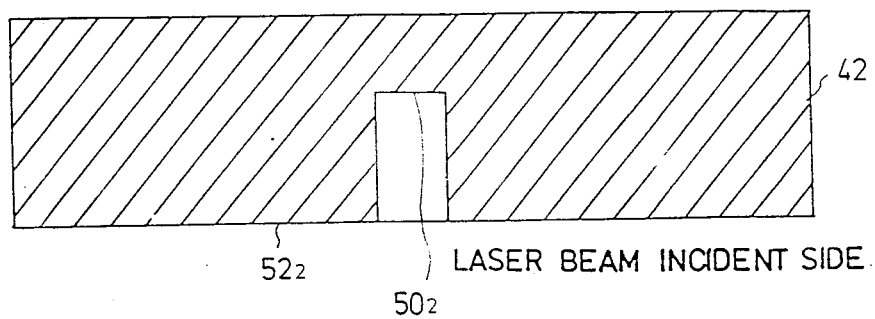
F I G. 9 (B)
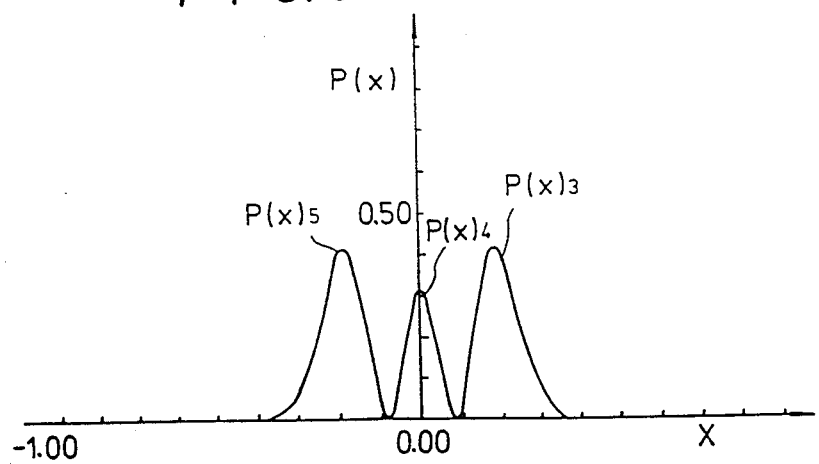

FIG. 10 (A) (THIRD-ORDER TRANSVERSE MODE)
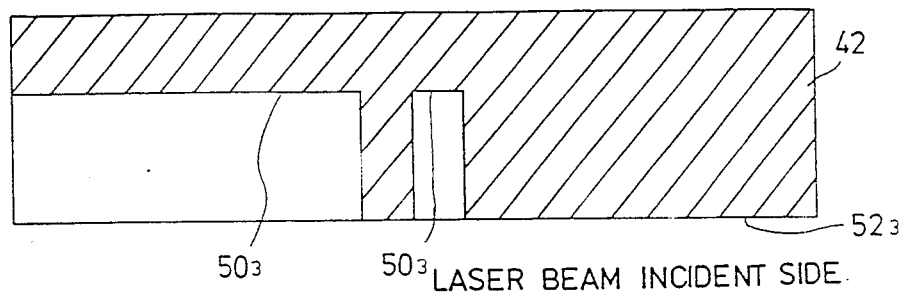
FIG. 10 (B)
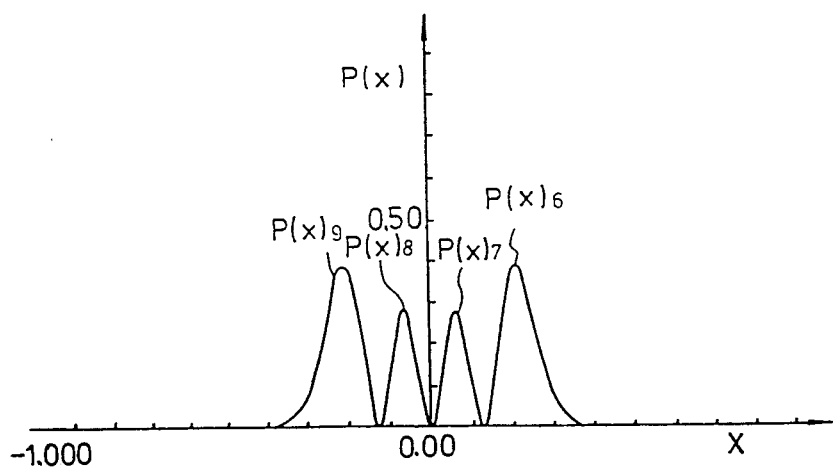

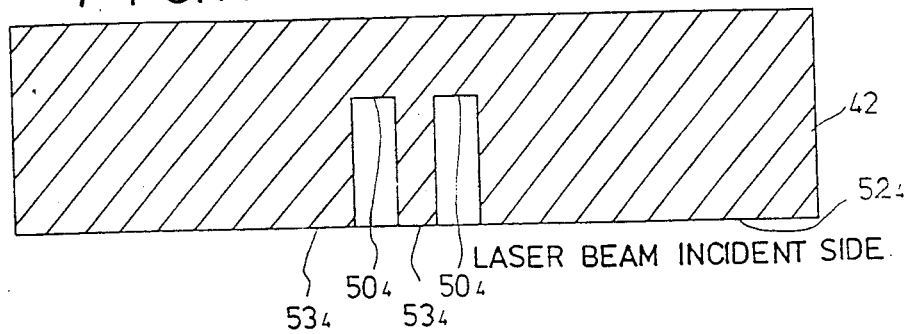
FIG.11(A) (FOURTH-ORDER TRANSVERSE MODE)
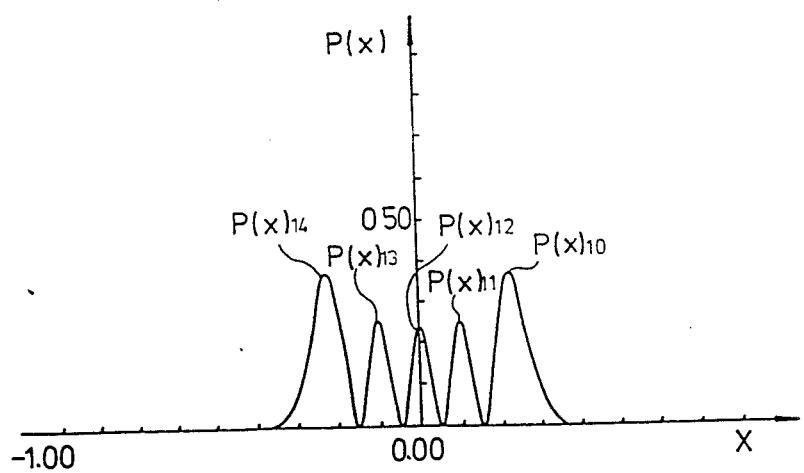
FIG.11(B)

FIG. 12(A) (FIFTH-ORDER TRANSVERSE MODE)
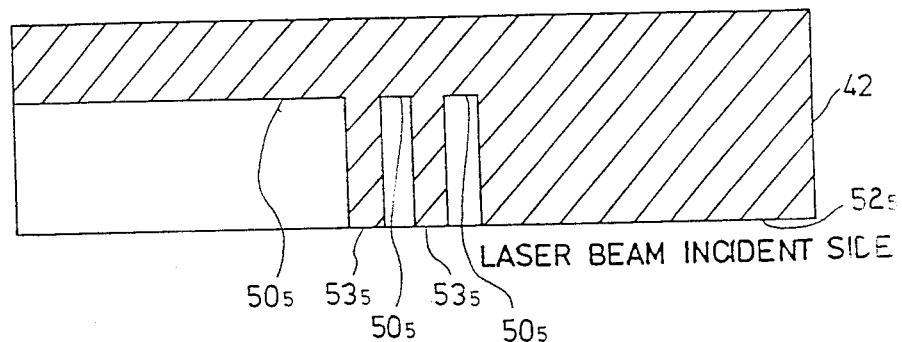
FIG. 12(B)
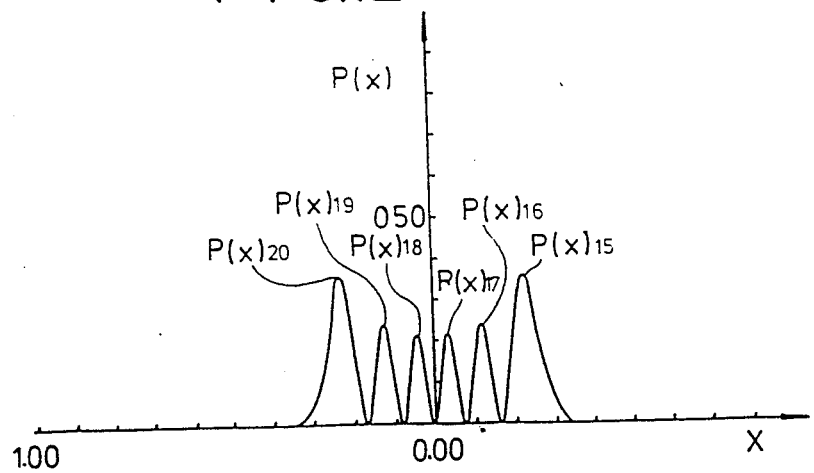

LASER OPTICAL SYSTEM

BACKGROUND OF THE INVENTION

1. Field of the Invention

This invention relates to a laser optical system, and more specifically to a laser optical system which is suitable for use in an optical recording apparatus adapted to record information such as text or the like on a recording medium using lasers such as a phase synchronizing semiconductor laser and a broad contact semiconductor laser which oscillate in transverse multimodes.

2. Description of the Related Art

A phase synchronizing semiconductor laser has been constructed as a multistripe laser diode array, as illustrated in FIG. 2, in which stripe-shaped waveguides are used. Namely, from several to several tens of laser oscillating regions 12 are arranged parallel in a common single plane, by dividing an active layer which is formed in parallel with a plane of a pn junction 10 into a plurality of stripes, thereby forming a multiple heterojunction structure. In the above-described structure, each laser oscillating region operates at a fundamental transverse mode. Each adjacent laser oscillating region is coupled together at the energy level. The phases of laser beams emitted from the respective laser oscillating regions are synchronized, so that they oscillate in transverse multimodes to provide a high output. Two suitable semiconductor lasers are the SDL-2410 and SDL-2420 series (manufactured by Spectra Diode Laboratories, Inc., Trademark), etc.

There is, however, a phase difference between laser beams which are emitted from the respective laser oscillating regions of such a semiconductor laser. When the phase difference between laser beams emitted from each laser oscillating region is 180°, it is known that two lobes are formed in a direction parallel to the plane of the pn junction in a far field pattern as illustrated in FIG. 3. Even when laser beams capable of forming two such lobes are used to record on a recording medium, the laser beams do not converge toward one spot. It is not therefore possible to create an optical system having high resolution. When it is desired to record information on a microfilm by using laser beams to create dots, it is necessary to obtain resolution in the order of 3360 dots/7.2 mm. Hence, to record dots at very high accuracy, poses a problem.

The conventional solution to such a problem has been to propose that one lobe be cut off by making use of each optical system shown in FIGS. 4(A) and 4(B) [Appl. Phys. Lett. 41 (12), 15 Dec. 1982]. A phase synchronizing semiconductor laser 14, a spherical lens 15, an aperture 18 extending in a direction perpendicular to the plane of the pn junction, a cylindrical lens 20 arranged to converge laser beams emitted from the laser, which are parallel with the plane of the pn junction and a pherical lens 21 are arranged in order in such an optical system. Laser beams emitted from the phase synchronizing semiconductor laser 14, which are in a direction perpendicular to the plane of the pn junction, are rendered parallel as illustrated in FIG. 4(A) and then pass through the aperture 18 and the cylindrical lens 20, so that they are focused on a recording media 24 through the spherical lens 21. These laser beams are parallel to the plane of the pn junction and are focused on an imaginary spot of the aperture 18 by the spherical lens 15 as shown in FIG. 4(B), so that well-defined far-field patterns are formed on the focal point. The aperture 18 passes only those laser beams which form one of the lobes while cutting off those beams which form the other lobe. The laser beams which pass through the aperture 18 are rendered parallel by the cylindrical lens 20 so that they are focused on the recording medium 24 through the spherical lens 21. Well-defined spots with diameters of several micrometers can therefore be obtained.

However, since one of the laser beams capable of forming the lobes has been cut off, the above-described conventional optical system is accompanied by a problem in which the light intensity of the laser beams which are emitted in the direction parallel to the plane of the pn junction is halved. The resulting poor efficiency makes such a laser beam inadequate for applications which require high energy during recording, e.g., heat-mode recording materials such as a laser direct recording film.

On the other hand, Japanese Patent Application No. 98320/1987 discloses that two lobes are separated subsequent to the formation of laser beams into a bundle of parallel rays to combine the two lobes into one by making use of a reflecting mirror, a ½ wavelength plate and a polarizing beam splitter. The use of the optical system which is disclosed in the application referred to above makes it difficult to obtain complete parallel rays in practice. Where each optical path of the respective lobes is not equal, the optical position of a beam waist to be formed upon convergence through the last lens is deviated from the optical axis, thereby making it difficult to converge the laser beams at a high energy density.

In a broad contact semiconductor laser having plural memories width optical waveguides, where each width of the stripes have at least a predetermined value which corresponds to 10 micrometers or greater, laser beams having high outputs of several hundreds mW to 1 W can be obtained. Less restriction on transverse directions is, however, made owing to the broad width of each stripe to multimode transverse modes. Such a broad contact semiconductor laser is therefore accompanied by a problem in which laser beams cannot be focused on a spot in the order of several microns as in the abovedescribed phase synchronizing semiconductor laser. Incidentally, there are two types of broad contact semiconductor lasers, one making use of refractive index-guiding and the other gain-guiding.

SUMMARY OF THE INVENTION

This invention has been completed to solve the above-described problems. It is thus an object of the present invention to provide a laser optical system which permits focusing of well-defined spots utilizing laser beams while minimizing the energy loss of the laser beams emitted from a laser which oscillates in transverse multimodes.

In one aspect of this invention, there is thus provided a laser optical system, which comprises:

a laser capable of oscillating in transverse multimodes;

a light-path-deflecting optical system provided on the emitting side of the laser and adapted to change the direction of the light beam;

a spectral element adapted to separate each laser beam spectroscopically which passes through the light-path-deflecting optical system;

a lens for permitting focusing of each laser beam separated spectroscopically by the spectral element; and a phase correcting element arranged at a focusing position by the lens and adapted to correct phases of each of the laser beams so as to obtain Gaussian beams, whereby the laser beams are reflected in the same direction as the incident beams.

The above-described spectral element can separate the laser beams spectroscopically in such a way that the transverse modes for each order of the laser beams appear as their corresponding radiation region on the respective phase correcting elements.

The effects of the laser optical system according to this invention will next be described. The laser in this invention oscillates in transverse multimodes. Suitable for this purpose would be a multistripe phase synchronizing semiconductor laser constructed in such a way that plural narrower laser oscillating regions are arranged parallel in a predetermined direction and a broad contact semiconductor laser having a width of stripes of at least a predetermined value which corresponds to 10 micrometers or greater. Laser beams emitted from the laser are irradiated to a spectral element via a light-path deflection optical system. A diffraction grating and a prism, etc., can be used as the spectral element. The laser beams are focused on a phase correcting element in a form said that images of transverse multimodes have been separated respectively by a lens and the spectral element. Such focusing can be attained by the arrangement of the lens on the incident side or exit side of the spectral element. The phase correcting element is designed to correct phases of each of the separated transverse modes so as to obtain Gaussian beams subsequent to passage of the laser beams through the spectral element and the lens in a direction opposite to the above-described direction, thereby to reflect the laser beams in the same direction as the incident beams. The laser beams thus reflected form the Gaussian beams, namely, the intensity distribution at a cross section perpendicular to the advancing direction of the laser beams obtains a Gaussian distribution subsequent to the passage of the laser beams through the spectral element and the lens.

As has been described above, the laser optical system according to this invention can bring about such advantages in which energy loss of laser beams emitted from the laser is minimized in order to obtain a well-defined single spot by the laser beams since the system is designed to form the Gaussian beams by correcting phases of the laser beams without cutting off the laser beams.

BRIEF DESCRIPTION OF THE DRAWINGS

The above and other objects, features and advantages of the present invention will become apparent from the following description and the appended claims, taken in conjunction with the accompanying drawings, in which:

FIG. 6 is an enlarged diagram of a spectral pattern in a longitudinal mode;

FIGS. 7(A) through 12(A) respectively show cross-sections taken along lines I—I to VI—VI of FIG. 5 and FIGS. 7(B) though 12(B) illustrate intensity distribution diagrams in transverse modes corresponding to the respective cross-sections.

DETAILED DESCRIPTION OF THE INVENTION AND PREFERRED EMBODIMENTS

Figure 1C:
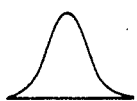
FIG. 1(C) diagrammatically shows an intensity distribution of the laser beam which is obtained by the laser optical system.
Figure 1A:
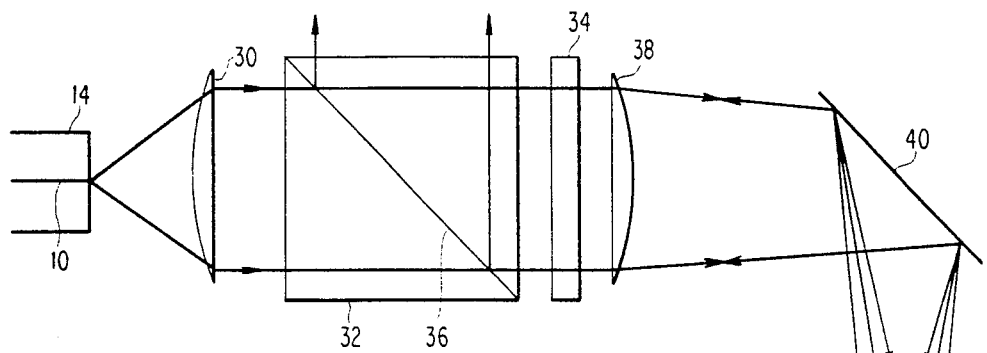
FIG. 1(A) is a plan view of a laser optical system according to one embodiment of this invention.
Figure 1B:
FIG. 1(B) diagrammatically shows a near field pattern of a laser beam emitted from a semiconductor laser.

The embodiments of this invention will hereinafter be described in details with reference to the accompanying drawings. FIG. 1(A) shows an optical system of the present embodiment, in which a collimator 30 which collimates a laser beam is arranged on the emitting side of a broad contact semiconductor laser 14 the laser is provided in such a way that the plane of the pn junction 10 extends in a direction perpendicular to the drawing sheet. A near field pattern of.the laser beam emitted from the broad contact semiconductor laser 14 is formed as shown in FIG. 1(B), and is in parallel with the plane of the pn junction 10. A polarizing beam splitter 32 is provided on the laser beam emitting side of the collimator 30 in such a way that a junction 36 extends at an angle of 45° with respect to the advancing direction of the laser beam. The polarizing beam splitter 32 has been constructed by depositing an alternate multilayer film, which comprises a high refractive-index material and a low refractive-index material, on the oblique surface of each of two rectangular prisms and bonding them together at their oblique surfaces. The polarizing beam splitter 32 transmits a P-polarized light which vibrates parallel to the plane of incidence and reflects an S-polarized light which vibrates in a direction perpendicular to the plane of incidence, namely, in the direction perpendicular to the drawing sheer. The broad contact semiconductor laser 14 and the polarizing beam splitter 32 are therefore provided in such a way that the laser beam emitted from the broad contact semiconductor laser 14 takes the form of the P-polarized light with respect to the polarizing beam splitter 32. A ¼ wavelength plate 34 is arranged on the laser beam exit side so that an optical axis extends at an angle of 45° with respect to a plane of polarization of the P-polarized light which is transmitted to the polarizing beam splitter 32. A light-path-deflection optical system is constructed by the polarizing beam splitter 32 and the ¼ wavelength plate 34. A lens 38, a reflection-type plane-diffraction grating 40, which serves as a spectral element, and a reflection-type phase correcting plate 42 provided on a focal surface of the lens 38 are arranged in order on the laser beam exit side of the ¼ wavelength plate 34.

The plane-diffraction grating 40 is arranged with its grooves extending in a direction parallel with the plane of the pn junction, namely, in a direction perpendicular to the drawing sheet. If an incident angle of the laser beam is $\alpha$, an angle of diffraction of the laser beam is $\beta$ and a wavelength of the laser beam is $\lambda$ in the plane-diffraction grating, the following equation can be established where m is an order of diffraction and d is a grating constant.

$$sin\alpha + sin\beta = m\lambda/d \quad (1)$$

Figure 1D:
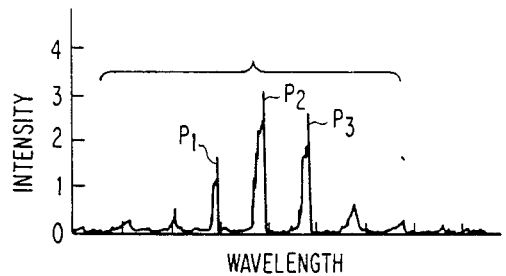
FIG. 1 (D) diagrammatically shows an intensity distribution in a longitudinal mode of one maximum of the laser beam.
Figure 2:
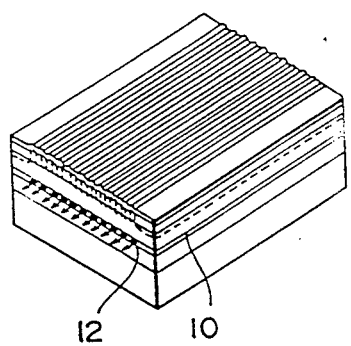
FIG. 2 is a perspective view showing an external appearance of a phase synchronizing semiconductor laser.
Figure 3:
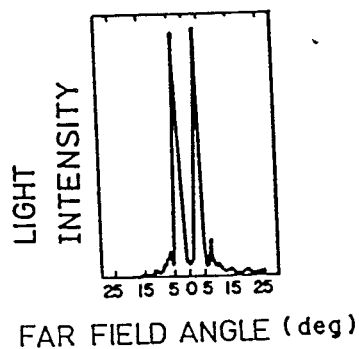
FIG.3 is a diagram illustrating a far field pattern.
Figure 4A:
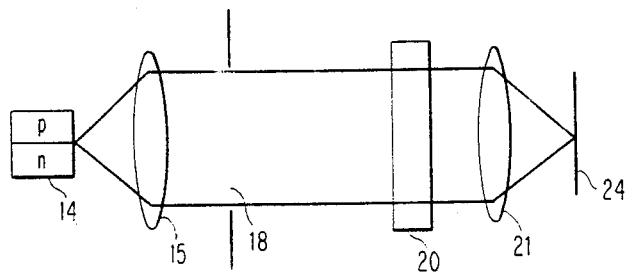
FIGS. 4(A) and 4(B) respectively are a plan view and a front view depicting conventional optical systems.
Figure 4B:
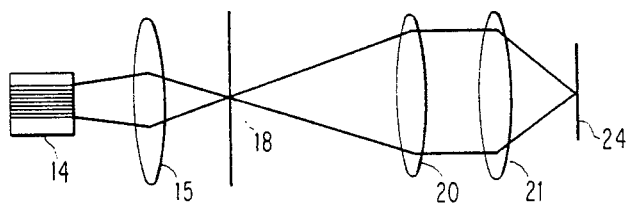

The diffraction beams of each order which are diffracted by the plane-diffraction grating 40 to meet the above-described equation (1) further form each of fine spectral patterns because of differences in each longitudinal mode. In addition, they also form separated fine patterns because of differences in each transverse mode. A plurality of fine transverse modes having different orders have been superposed on each of peaks $P_1$, $P_2$, $P_3$ . . . , each showing each longitudinal mode, said peaks corresponding to maxima, as shown in FIG. 1(D). Incidentally, symbols are marked only on the corresponding three peaks in the drawing FIG. 6 shows an enlarged diagram of spectral patterns in the longitudinal modes, in which each of the peaks $P_1$, $P_2$ and $P_3$ contains components of the transverse modes for zero-order, second-order, third-order and fourth-order alone. In addition, referring to FIG. 5, patterns for each of the transverse modes on the phase correcting plate 42 form Hermite distributions.

On the other hand, the phase correcting plate 42 is produced by depositing a reflective coating such as aluminium and a protective coating on a surface of a hologram on which rough patterns are formed by the technique of the holography. At the same time, the phase correcting plate 42 is curved to reflect light in the same direction as the incident direction and is arranged on the focal surface of the lens 38.

Figure 5:
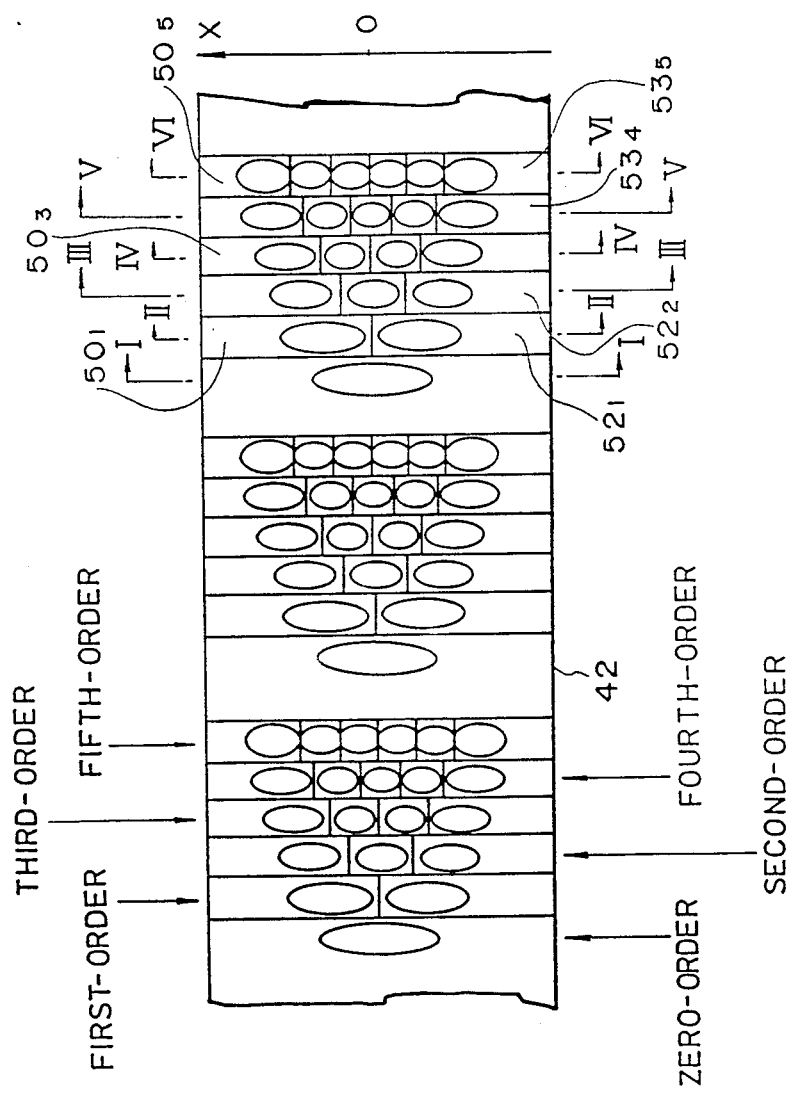
FIG. 5 diagrammatically shows the relationship between diffraction images and a flat configuration of a phase correction plate.

A description will next be made of the rough patterns for the phase correcting plate 42 by taking as an example where the components of the fine transverse modes of each of the zero-order to fifth-order have been superposed on each of the peaks which show the longitudinal modes of the diffraction images The patterns of the transverse modes for the diffraction images are formed as shown in FIG. 5 and appear as radiatid regions in the transverse modes of the zero-order to fifth-order corresponding to each of the peaks. There is one luminescent point in the zero-order transverse mode, two in the first-order transverse mode and three, four, five and six in the second-order to the sixth-order transverse modes respectively. Although it is not necessary to perform a phase correction because of one luminescent point in the zero-order transverse mode, the need for the phase correction takes place because there are plural radiatid region for a transverse mode of the first or higher order and because of the existence of a phase difference between each of two radiatid regions. FIGS. 7(A) through 12(A) respectively show cross-sectional shapes along lines, I—I to VI—VI of the phase correcting plate 42, which are depicted in FIG. 5, in correspondence to the intensity distribution, namely Hermite distribution, of the respective transverse modes, as seen in FIGS. 7(B) through 12(B). In each of the intensity distributions, the axis x of abscissa indicates positions while the axis P (x) of the ordinate gives relative intensities corresponding to the positions (x).

The intensity distribution of the zero-order transverse mode is formed as shown in FIG. 7(B). There is no need for phase correction because of one radiatid regions. Accordingly, the cross-sectional shape of the phase correcting plate 42 taken along line I—I of FIG. 5 is flat, as shown in FIG. 7(A).

As depicted in FIG. 8(B), the intensity distribution of the first-order transverse mode contains peaks $P(x)_1$ and $P(x)_2$ which correspond to two radiated regions respectively. There is however a phase. difference of $\pi$, which corresponds to 80 /2, where $\lambda$ is a wavelength of the first-order transverse mode, between the peaks $P(x)_1$ and $P(x)_2$. When a phase of the peak $P(x)_2$ is corrected by $\lambda/2$ using a phase of the peak $P(x)_1$ as a reference, a phase shift of the first-order transverse mode can be eliminated accordingly. To correct the phase by $\lambda/2$, it is only necessary to leave an optical path difference of $\lambda/2$ between the beams. Since the phase correcting plate 42 is designed to correct the phase by reflection, it is necessary to set the depth h of the indentation 50_1, at $\lambda/4$ as illustrated in FIG. 8(A). Since the laser beam which entered the indentation 50_1 is reflected in an incident direction, the optical path difference of $\lambda/2$ is given in both ways with respect to the laser beam which as a consequence fell on a reference surface $52_1$.

As depicted in FIG. 9(B), the intensity distribution of the second-order transverse mode contains peaks $P(x)_3$, $P(x)_4$, and $P(x)_5$ which correspond to three radiatid regions respectively. The peak $P(x)_3$ and $P(x)_5$ are of the same phase while the peak $P(x)_4$ is phase-shifted by $\lambda/2$, where is a wavelength of the second-order transverse mode, with respect to each of the peaks $P(x)_3$ and $P(x)_5$. Accordingly, a surface from which laser beams of the peaks $P(x)_3$ and $P(x)_5$ enter is used as the reference surface $52_2$ and further another surface from which a laser beam of the peak $P(x)_4$ enter is used as an indentation $50_2$ and the depth of the indentation $50_2$ is set at $\lambda/4$.

As depicted in FIG. 10(B), the intensity distribution of the third-order transverse mode contains peaks $P(x)_6$, $P(x)_7$, $P(x)_8$, and $P(x)_9$ which correspond to four radiatid regions respectively. Peaks $P(x)_6$ and $P(x)_8$ are of the same phase as are peaks $P(x)_7$ and $P(x)_9$ However, a phase difference of $\lambda/2$, where $\lambda$ is a wavelength of the third-order transverse mode develops between peaks $P(x)_6$ and $P(x)_7$. Accordingly, a surface from which laser beams of peaks $P(x)_6$ and $P(x)_8$ enter is used as a reference surface $52_3$, and another surface from which laser beams of peaks $P(x)_7$ and $P(x)_9$ enter is used as an indentation in which the depth of the indentation is set at $\lambda/4$.

As depicted in FIG. 11(B), the intensity distribution of the fourth-order transverse mode contains peaks $P(x)_{10}$, $P(x)_{11}$, $P(x)_{12}$, $P(x)_{13}$, and $P(x)_{14}$ which correspond to five luminescent points respectively. Peaks $P(x)_{10}$, $P(x)_{12}$ and $P(x)_{14}$ are of the same phase as are peaks $P(x)_{11}$ and $P(x)_{13}$. However, there is a phase difference of $\lambda/2$, where $\lambda$ is a wavelength of the fourth-order transverse mode, between peaks $P(x)_{10}$ and $P(x)_{11}$. Accordingly, a surface from which laser beams of peaks $P(x)_{10}$, $P(x)_{11}$ and $P(x)_{12}$ enter, is used as a reference surface $52_4$ and another surface from which laser beams of peaks $P(x)_{11}$ and $P(x)_{13}$ enter is used as an indentation $50_4$ in which the depth of the indentation is set at $\lambda/4$.

As depicted in FIG. 12(B), the intensity distribution of the fifth-order transverse mode contains peaks $P(x)_{15}$, $P(x)_{16}$, $P(x)_{17}$, $P(x)_{18}$, $P(x)_{19}$, and $P(x)_{20}$ which correspond to six radiatid regions respectively. Peaks $P(x)_{15}$, $P(x)_{17}$, and $P(x)_{19}$ are of the same phase as are peaks $P(x)_{16}$, $P(x)_{18}$ and $P(x)_{20}$. However, a phase difference of $\lambda/2$, where $\lambda$ is a wavelength of the fifth-order transverse mode, develops between peaks $P(x)_{15}$ and $P(x)_{16}$.

Accordingly, a surface from which laser beams of peaks $P(x)_{15}$, $P(x)_{17}$ and $P(x)_{19}$ enter, is used as a reference surface $52_5$ and another surface from which laser beams of peaks $P(x)_{16}$, $P(x)_{18}$ and $P(x)_{20}$ enter, is used as an indentation $50_5$ in which the depth of the indentation is set at $\lambda/4$.

Similarly, the rugged patterns can also be determined for the transverse modes of sixth or higher orders.

As described above, the rough patterns of the phase correcting plate 42 are formed corresponding to diffraction images, namely, radiatid regions of the transverse modes on the phase correcting plate 42. The phase correcting plate 42 is designed not to perform a phase correction with respect to the radiated regions for the zero-order transverse mode, but the rough patterns thereof have been determined to develop a phase difference of 90 between adjacent luminescent points in a transverse mode of each order with respect to radiated regions for transverse modes of the first-order or higher.

The operation of this embodiment will next be described. The laser beam, namely, P-polarized light which is emitted from the broad contact semiconductor laser 14 is rendered parallel by the colimator 30. The laser beam thereafter passes through the polarizing beam splitter 32 and is converted into a clockwise circularly polarized light by the ¼ wavelength plate 34, and then enters the plane-diffraction grating 40 via the lens 38. After thus entering the plane-diffraction grating 40 the laser beam is then diffracted by the plane-diffraction grating 40. The diffraction image thus obtained is focused on the phase correcting plate 42. At this time, the laser beam is reflected by the plane-diffraction grating 40, so that it is converted from the clockwise circularly polarized light to a counterclockwise circularly polarized light. The diffraction image repeatedly appears at diffraction positions which are determined by the wavelengths of oscillating longitudinal modes for the respective orders of the combinations of radiated regions in transverse modes of zero-order, first-order . . . , $m^{th}$-order as shown in FIG. 5. Each of the radiated regions enters its corresponding reference surface or indentation and is reflected in the same direction as the incident direction. The phase between each adjacent luminescent point is corrected so as to be in the same phase by reflecting the radiated regions at each indentation or reference surface of the phase correcting plate 42. Laser beams reflected by the phase correcting plate 42 are reflected again by the plane-diffraction grating 40 to be combined together and thereafter enter the ¼ wavelength plate 34 via the lens 38. Here, the counterclockwise circularly polarized light which entered the phase correcting plate 42 is reflected by the phase correcting plate 42 and the plane-diffraction grating 40, namely, its reflection occurs twice. The circularly polarized light thereafter enters the ¼ wavelength plate. As a result, the laser beam enters the ¼ wavelength plate as the counterclockwise circularly polarized light. Such counterclockwise circularly polarized light is converted into a S-polarized light by the ¼ wavelength plate 34 so as to enter the polarizing beam splitter 32 and is then reflected at the junction 36 of the polarizing beam splitter 32. Since each phase for the respective orders in transverse modes has been corrected by the phase correcting plate 42 as described above, the intensity distribution of the cross section which extends in a direction perpendicular to the advancing direction of the laser beam reflected at the junction 36 of the polarization beam splitter 32 forms the Gaussian distribution as illustrated in FIG. 1(C).

Accordingly, beam spots of high energy can be obtained by converging the Gaussian beams formed in the above described manner by the lens.

Figures 13A, 13B:
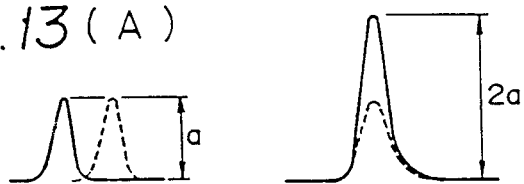
FIGS. 13(A) and 13(B) respectively show the light intensity of the laser beam according to this embodiment in comparison with that of a conventional laser beam.

FIGS. 13(A) and 13(B) diagrammatically show the light intensity of the laser beam according to this embodiment in comparison with that of the conventional laser beam of which one of the lobes has been cut off. The light intensity of this embodiment as shown in FIG. 13(B) has as much as twice the light intensity as the conventional example depicted in FIG. 13(A).

Incidentally, when the above-described laser optical system is employed in the optical recording apparatus, there is need for a scanning optical system which is constructed of a rotary polygon mirror, a galvanometer and a scanning lens, etc, at the Gaussian beam exit side of the polarizing beam splitter.

In the above description, the broad contact semiconductor laser is used by way of example. However, in the above description, a phase synchronizing semiconductor laser may also be employed. Although the diffraction image does not form the Hermite distribution in this case, it is only necessary to determine rough patterns of the phase correcting plate corresponding to positions of radiated regions, to correct the phase of the diffraction image between adjacent radiated regions by $\lambda/2$ in the same manner as described above. Namely, when the diffraction grating is used as a spectral element and at the same time the phase synchronizing semiconductor laser is employed as a laser, it is necessary to provide the diffraction grating in such a way that the extending direction of its grooves becomes parallel to the direction of arrangement of the multiple stripes of the phase synchronizing semiconductor laser, i.e., the direction of emission of each laser beam in a transverse mode. As a result, each laser beam is separated to extend in a direction perpendicular to the direction of emission of one or more laser beams in the transverse modes, so that their maxima are aligned side by side in directions perpendicular to the direction of emission of laser beams in a transverse mode. At this time, the fine transverse modes are separated by the diffraction and at the same time, each phase of the fine transverse modes is corrected by each of the phase correcting elements in the above-described manner, so that the Gaussian beams can be obtained. In addition, the positions of the phase correcting elements with respect to each of the transverse modes have already been determined. Steady-state Gaussian beams can therefore be obtained so long as rough patterns are determined in such a way that regions of the rough patterns can be covered sufficiently and the phase correcting elements are arranged in advance, even when oscillation is unstable and various transverse modes are produced at random. A solid-state laser, gas laser or the like may also be used.

Further, in the above description, the diffraction grating is used as the spectral element by way of example. However, a spectral element such as a prism may also be employed; or a transmission type diffraction grating may also be used as the diffraction grating. In the above description, the polarizing beam splitter is employed in the light-path deflecting optical system by way of example. Polarizing prisms such as a Wollaston prism or a Senarmont prism. may, however, be used. In the above description, laser beams are caused to enter the polarizing beam splitter as P-polarized light from the semiconductor laser by way of example. The laser beams may however enter the polarizing beam splitter as S-polarized light. Further, the lens 38 may be provided between the plane-diffraction grating 40 and the phase correcting plate 42, or a Faraday rotator may be used in place of the ¼ wavelength plate to rotate the plane of polarization over 90°.

What is claimed is:

1. A laser optical system, comprising:
   a laser capable of oscillating in transverse multimodes and radiating multiple parallel output beams at an emitting side;
   a light-path-deflecting optical system provided on said emitting side of the laser and adapted to provide a common direction for said laser output;
   a spectral element adapted to separate each laser beam which passes through the light-path-deflecting optical system spectroscopically;
   lens means positioned to receive each laser beam separated spectroscopically by the spectral element and operative to focus each said beam; and
   a phase correcting element provided at a focusing position of the lens and adapted to correct phases of each of the laser beams so as to obtain Gaussian beams, whereby the laser beams are reflected.

2. A laser optical system as claimed in claim 1, wherein the spectral element is adapted to separate the laser beams spectroscopically in such a way that the respective transverse modes for each order of the laser beams appear as their corresponding radiated regions on the respective phase correcting elements.

3. A laser optical system as claimed in claim 2, wherein the phase correcting element is provided at the lens focusing position and designed to correct a phase difference between each adjacent radiated region for the respective transverse mode of each order separated spectroscopically by means of the spectral element, thereby to reflect the laser beams in the same direction as the incident beams.

4. A laser optical system as claimed in claim 3, wherein the phase difference is $\pi$.

5. A laser optical system as claimed in claim 1, wherein the light-path-deflecting optical system comprises:
   a polarizing beam splitter provided on the emitting side of the laser, said polarizing beam splitter being adapted to transmit a P-polarized light beam and to reflect an S-polarized light beam in a direction different from that of transmission of the P-polarized light; and
   a ¼ wavelength plate provided on the P-polarized light beam transmitting side of the polarizing beam splitter.

6. A laser optical system as claimed in claim 1, wherein said transverse multimodes include parallel input beams with a broad contact semiconductor laser, and non-parallel input beams with a phase synchronizing semiconductor laser.

7. A laser optical system, comprising:
   a broad contact semiconductor laser having a width of each stripe of at least a predetermined value and operative to radiate multiple parallel output beams at an emitting side;
   a polarization beam splitter provided on said emitting side of the laser, said polarization beam splitter being adapted to transmit a P-polarized light beam and to reflect an S-polarized light beam in a direction different from that of transmission of the P-polarized light; and
   a ¼ wavelength plate provided on the P-polarized light transmitting side of th epolarization beam splitter;
   a plane-diffraction grating adapted to separate spectroscopically, by making use of diffraction, the P-polarized laser beam which passes through the ¼ wavelength plate;
   lens means for focusing each of the laser beams which are generated by separating said laser beam by dispersion by the spectral element; and
   a phase correcting element provided at the diffraction focusing position of the lens and adapted to correct phases of each of the laser beams to obtain a Gaussian beam from the reflected beam.

8. A laser optical system as claimed in claim 7, wherein the plane-diffraction grating is adapted to separate the laser beams spectroscopically in such a way that the respective transverse modes for each order of the laser beams appear as their corresponding radiated regions on each of the phase correcting elements.

9. A laser optical system as claimed in claim 8, wherein the lens is provided between the ¼ wavelength plate and the plane-diffraction grating.

10. A laser optical system as claimed in claim 9, wherein the phase correcting element is provided at the lens focusing position and designed to correct a phase difference between each adjacent radiated region for the respective transverse mode of each order separated spectroscopically by means of the spectral element, thereby to reflect the laser beams in the same direction as the incident beams.

11. A laser optical system as claimed in claim 8, further comprising a collimator provided between the broad contact semiconductor laser and the polarization beam splitter so that the laser beam emitted from the broad contact semiconductor laser is rendered parallel.

12. A laser optical system as claimed in claim 11, wherein the phase correcting element is provided at the lens focusing position and designed to correct a phase difference between each adjacent luminescent point for the respective transverse mode of each order separated spectroscopically by means of the spectral element, thereby to reflect the laser beams in the same direction as the incident beams.

13. A laser optical system as claimed in claim 8, wherein the phase correcting element is provided at the lens focusing position and designed to correct a phase difference between each adjacent radiated region for the respective transverse mode of each order separated spectroscopically by means of the plane-diffracting grating, thereby to reflect the laser beams in the same direction as the incident beams.

14. A laser optical system as claimed in claim 7, wherein the lens is provided between the ¼ wavelength plate and the plane-diffraction grating.

15. A laser optical system as claimed in claim, 7, further comprising a collimator provided between the broad contact semiconductor laser and the polarization beam splitter so that the laser beam emitted from the broad contact semiconductor laser is rendered parallel.

* * * * *